United States Patent [19]

James

[11] Patent Number: 4,700,188
[45] Date of Patent: Oct. 13, 1987

[54] ELECTRIC POWER MEASUREMENT SYSTEM AND HALL EFFECT BASED ELECTRIC POWER METER FOR USE THEREIN

[75] Inventor: Wesley James, New York, N.Y.

[73] Assignee: Micronic Interface Technologies, New York, N.Y.

[21] Appl. No.: 696,167

[22] Filed: Jan. 29, 1985

[51] Int. Cl.⁴ .............................................. G08C 19/16
[52] U.S. Cl. ................. 340/870.03; 324/110; 340/310 A; 361/81
[58] Field of Search ................... 340/870.03, 637, 657, 340/310 A, 310 R; 324/110, 137, 142; 364/492; 361/78, 81

[56] References Cited

U.S. PATENT DOCUMENTS

| 4,442,492 | 4/1984 | Karlsson et al. | 324/142 X |
| 4,500,973 | 2/1985 | Ley | 324/142 X |
| 4,514,685 | 4/1985 | Gilker | 324/142 |

Primary Examiner—Jerry W. Myracle

[57] ABSTRACT

A system for measuring electric power supplied through a power distribution network and, inter alia, detecting theft of power from the network, and a remote reading Hall effect based electric power meter for use therein are both described.

23 Claims, 2 Drawing Figures

ELECTRIC POWER MEASUREMENT SYSTEM AND HALL EFFECT BASED ELECTRIC POWER METER FOR USE THEREIN

BACKGROUND OF THE INVENTION

1. Field of the Invention

The invention relates both to a system for measuring electric power supplied through a power distribution network and, inter alia, detecting theft of power from the network, and to a remote reading Hall effect based electric power meter for use therein.

2. Description of the Prior Art

Over the past decade, fuel supplies, particularly crude oil, have become increasingly scarce and consequently have sharply escalated in price. Of necessity, electric utilities, particularly those dependent on oil, have often attempted to increase their prices to all their customers in an attempt to recover the increased cost of fuel. However, electric utilities have come under substantial pressure from both consumer groups and regulatory authorities to adequately justify each increase. More often than not, these utilities have been allowed to increase their prices far less than they originally requested. As a result, electric utilities find themselves under significant economic pressure to reduce their costs in order both to meet current expenses and to maintain their profits at an appropriate level sufficient to attract new sources of investment capital. Reducing costs often entails finding and exploiting economies in all areas of power generation, including but not limited to obtaining economical fuel sources. For example, as discussed in detail below, significant economies can be obtained in metering.

Electric power is supplied to every customer by wire, i.e. over power lines. Owing to the losses inherent in this supply process, a meter must be placed at the location of each customer site to measure the amount of electric power consumed there. At present, such a power meter comprises a relatively large electro-mechanical device which generally employs a disk that rotates at a speed proportional to the simultaneous power consumption. This disk is, in turn, mechanically coupled to a counter, visible on the face of the meter, which continuously totalizes the number of times the disk rotates. The value displayed at any instant is the meter "reading" and it represents the total amount of power measured by the meter since it was first placed in service. In order to bill each customer for the amount of power it consumes during any given period, a utility must first read the meter existing at the site of that customer and then subtract the meter reading occurring at the beginning from that occurring at the end of the period. At present, generally all utilities read their meters manually. In other words, a human meter reader visits each customer site and records the reading on each meter situated there. These readings are then brought back to a central location where they are then manually entered into a computer or other data processing equipment which generates customer bills.

Such a metering system possesses two major drawbacks -- the meter itself and the manner in which it is read, both of which result in significant expense for a utility.

First, regarding the meter itself, electro-mechanical rotating disk type meters are expensive devices and, in certain instances, somewhat inaccurate. Although these meters are quite reliable and possess a rather long useful lifetime, often stretching to 20 to 30 years, their acquisition cost is high, generally running to $500 or more per meter. In addition, the rotating disk assembly and the inter-connected counter possess a certain amount of mechanical inertia which slows the response of the meter. This, in turn, often prevents the meter from quickly reacting to load changes which result in short term increases (often lasting less than a second and commonally referred to as "surges") in consumption. Consequently, these meters might react somewhat to a relatively long lasting surge but more likely, since most surges are relatively short, will completely ignore it. Inasmuch as most electric utilities supply huge numbers of consumers, any one of which can momentarily consume a sizable amount of power in a surge, a utility loses significant amounts of revenue by not measuring the power consumed by all its customers during surges and charging for this power. To account for this loss, some utilities might assume, that a certain amount of power will be consumed during surges, and accordingly adjust their rates upward to recover what would otherwise be totally lost revenues. However, these utilities have no accurate way of checking their assumptions against actual consumption patterns to validate and/or correct these assumptions in order to minimize their lost revenue.

Furthermore, with the price of electricity steadily rising, a large and increasing amount of electricity is being stolen from the power lines. Since each customer has access to its incoming electrical wiring, it is relatively easy for anyone to wire around (by-pass) a meter and hence receive unmeasured power. Inasmuch as theft of electrical power is now a crime in most, if not all, jurisdictions thereby slowing, at least hopefully, the growth of this crime, stolen power still accounts for significant lost utility revenues. With the present manually read metering system, utilities must wait until after they have processed the meter readings taken at the end of a measurement period in order to determine measurement discrepancies indicative of theft. Unfortunately, the time lag, occurring between the time theft occurs and the time this theft is finally detected, is often too long to prevent the utility from taking quick corrective action to minimize its lost revenue. Oftentimes, sophisticated thieves may steal power at certain selected times or for certain selected intervals in order to disguise their meter readings and thereby avoid detection either completely or for prolonged periods, hence depriving the utility of long term revenues.

Now, second, apart from the meter itself, manual meter reading is a very slow, labor intensive process which is inordinately expensive. A skilled meter reader may be able to read anywhere from typically 20 to 100 meters a day depending upon where the meters are situated. The rate might be far less in a rural community where individual meters are geographically separated by wide distances and more in a typical city where many meters are often clustered together in one location. Since a typical utility might supply hundreds of thousands of separate customer sites and read each meter once every month or two, a utility must employ a significant number of meter readers. Moreover, the utility not only incurs the salary expense of a meter reader, but also the expense of providing and maintaining a vehicle for each meter reader to use. All these expenses often reach staggering proportions in fairly short periods of time and are always factored into the electric rate(s) charged by a utility.

It has been widely known for some time that use of a widespread automated power metering system employing relatively inexpensive, responsive, accurate and highly reliable meters which telemeter data back to a central location can yield substantial cost savings over the electro-mechanically based manually read metering systems in use today by most, if not all, of the electric utilities in the country. These automated systems are commonly referred to as "remote meter reading" systems. Unfortunately, while many such systems have been proposed, none has seen commercial use. For example, several systems, typified by that disclosed in U.S. Pat. No. 4,241,237 (issued to Paraskevakos et al on Dec. 23, 1980), rely on transmitting each meter reading over the telephone network to a central location for processing and hence require that each meter be connected to a telephone line thereby disadvantageously adding significant expense to the overall metering system. Other systems—typified by that disclosed in U.S. Pat. No. 4,350,980 (issued to Ward on Sept. 21, 1982); U.S. Pat. No. 3,656,112 (issued to Paull on Apr. 11, 1972) and U.S. Pat. No. 3,264,633 (issued to Hellar on Aug. 2, 1966)—rely on using the power line frequency as the carrier medium. By using the existing power network as both the source of electric power and the carrier medium, this method of transmitting data advantageously eliminates the need for a separate network, such as telephone, to carry the meter readings to a central location and hence significantly minimizes expense. However, these power line communication based metering systems known to the art all rely on using rotating disk meters which, as noted above, are expensive to purchase and slow to respond. Consequently, these systems fail to accurately measure surges. Hence, while these systems would certainly provide some economies over prior art manually read metering systems, these power line communication based metering systems known to the art fail to produce maximum cost savings to a utility. Moreover, none of these known remote meter reading systems, whether using power line communication or not, can readily detect power theft.

SUMMARY OF THE INVENTION

Accordingly, an object of the present invention is to provide a remote reading electric power metering system which achieves significant economies over the existant manually read electric power metering systems in use today.

A particular object is to provide a meter for use in such a system which is inexpensive and highly reliable.

Another particular object is to provide such a meter which is highly accurate.

A more particular object is to provide such a meter having an extremely fast response time and which can accurately measure surges in power consumption caused by short term load changes.

Another object is to provide such a metering system which can readily detect power theft, accurately determine its magnitude and quickly localize its source.

These and other objects are provided in accordance with the teachings of the present invention by a system, for measuring the amount of electrical power consumed throughout a power network, having: a measurement meter situated on each of the power lines upstream of an associated load, wherein the measurement meter includes means for measuring the instantaneous amount of electrical power consumed by the associated load, means for totalizing the instantaneous amount over a pre-defined period of time to generate a totalized value indicative of the total amount of power consumed by the associated load throughout the pre-defined time period, and means for transmitting the totalized value over the network upon receipt of an appropriate instruction; a master meter situated on a distribution line, wherein the master meter includes means for measuring the total amount of instantaneous electrical power flowing therethrough to all of the associated loads, means for providing a cumulative value indicative of the total amount of instantaneous power consumed by all the associated loads throughout the pre-defined period of time, and means for transmitting the cumulative value over the network upon receipt of an appropriate instruction; first processing means situated on said network for transmitting at least one of the instructions over the network to said measurement meters and for receiving the totalized value from each of the measurement meters, and second processing means situated on the network for transmitting other ones of the instructions over the network and for receiving the cumulative value from the master meter, wherein either the first or second processing means further includes means for summing all the totalized values to form an aggregate value, and means for comparing the aggregate value against the cumulative value to determine any unusual discrepancies therebetween indicative of power loss or theft.

Furthermore, the measurement meter used in the inventive system comprises: means, responsive to the voltage appearing on a power line and feeding an associated load, for providing a filtered signal that is proportional to the line voltage and contains substantially all voltage perturbations resulting from load induced consumption surges but is substantially free of any such perturbations resulting from spikes occurring in the line voltage; circuit means, responsive to the filtered signal, for generating first and second signals proportional to the values of load voltage and load current, respectively; communication means connected to the power line for establishing bi-directional communication, over the power line, between the meter and a location remote therefrom (e.g. a master meter and/or the central location); and processing means, connected to the circuit means and to the communication means and responsive to the first and second signals, for calculating the value of instantaneous power consumed by the load and for totalizing instantaneous power values over the pre-defined time period to produce a totalized value, and wherein the processing means, in response to an appropriate instruction appearing on the power line and received by the communication means, applies the totalized value to the communication means for transmission over the power line to the location remote therefrom.

As noted, the master meter measures the power consumed by all the loads fed by the distribution line; while, the measurement meter measures the power consumed by one such load. Apart from this difference, both the master and measurement meters have the same structure and operate in essentially the same manner—thereby advantageously reducing manufacturing and installation costs.

In accordance with a feature of the invention, each meter can calculate the power factor of its associated load in real time and transmit that information to the central location. This advantageously permits the utility to continually select the proper electric rate for each user and also to optimize the overall operation of its power generation equipment.

Moreover, in accordance with another feature of the invention, bi-directional power line communication can occur not only between the central location and any one meter, but also can occur on an inter-meter basis, e.g. between any master meter and any measurement meter both of which measure power originating from a common distribution line.

BRIEF DESCRIPTION OF THE DRAWING

The invention may be clearly understood by considering the following detailed description in conjunction with the drawing, in which.

To facilitate understanding, identical reference numerals are used to denote elements common to the figures.

DETAILED DESCRIPTION

Figure 1:
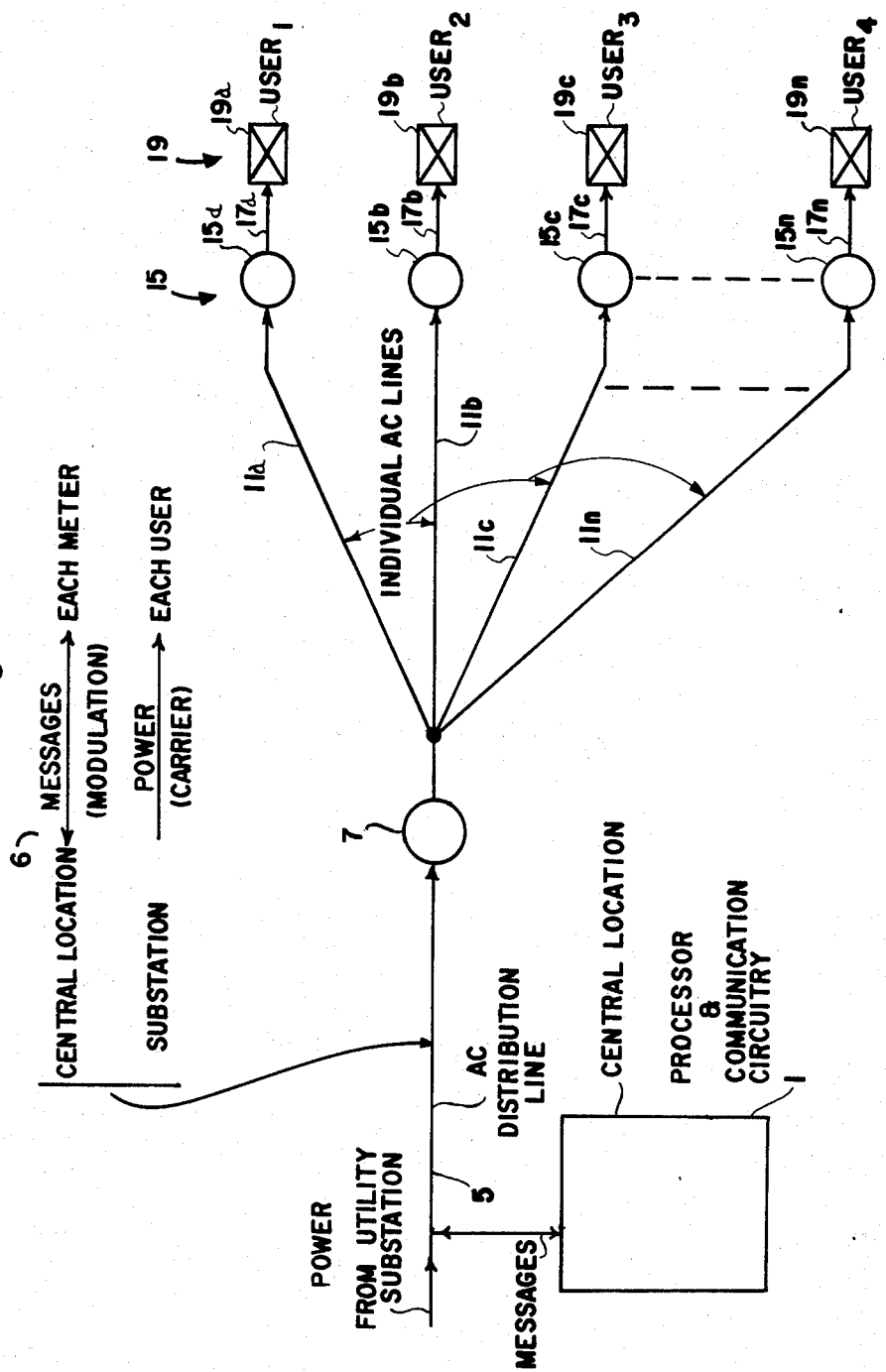
FIG. 1 is a block diagram of a metering system embodying the principles of the present invention and, for simplicity, shown implemented on a single typical power distribution line.

A metering system employing the principles of the present invention is shown in FIG. 1. This system relies on the use of two separate groups of meters: master meters and measurement meters. To simplify the figure, only one distribution line 5 feeding consumers 19 comprised of separate users 19a, 19b, 19c, ..., 19n is shown. Unless specific reference is made hereinafter to either a master meter or a measurement meter, the term "meter" encompasses both types of meters. In addition, a "load" is defined to be all the circuitry situated downstream of a meter and to which power is supplied through that meter. Hence, in FIG. 1, the load for master meter 7 consists of all the circuitry situated to the right of this meter, i.e. including users 19a, 19b, 19c, ..., 19n; while the load for measurement meter 15a is user 19a.

Moreover, from the following discussion, it will become readily apparent to anyone skilled in the art as to the manner in which the metering system shown in the figure can be easily extended to encompass any size power distribution network.

Furthermore, the system employs bi-directional power line communication for communicating meter readings and other information. This system can be readily configured, as discussed below, such that bi-directional power line communication occurs not only between each of the meters and a central location but also between the meters themselves, e.g. between master meter 7 and a measurement meter such as measurement meter 15a both measuring power originating with distribution line 5. However, for purposes of facilitating reader understanding, the following discussion and both figures will specifically address bi-directional communication occurring between the central location and any one meter. Based on the following, those skilled in the art will readily appreciate how the system shown and described below can be easily extended to encompass inter-meter communication.

Specifically, as shown, a utility sub-station applies AC power to AC distribution line 5. All the power supplied by this line and consumed by all the users connected thereto is measured by master meter 7. After the total amount of power flowing on distribution line 5 has been measured by master meter 7, this power is, in turn, routed through distribution lines 11, comprised of distribution lines 11a, 11b, 11c, ..., 11n, then through individual measurement meters 15a, 15b, 15c, ..., 15n, and finally via power lines 17a, 17b, 17c, ..., 17n, to consumers 19—consisting of individual users 19a, 19b, 19c, ..., 19n, respectively. Each measurement meter is connected to and measures the power consumed by one user. To minimize manufacturing cost, all the meters, i.e. both master meter 7 and each of the separate measurement meters, are essentially identical and operate in essentially the same fashion.

Each meter receives messages, originating from processing and communication circuitry 1 situated at a central or remote location (hereinafter all collectively referred to as the central location), transmitted through power line communication to every meter. These messages contain an appropriate address, an instruction and, in some instances, data. Each meter, during its installation, is programmed to respond to a unique address not shared by any other meter. In response to any messages containing a particular address, the meter programmed to that address responds to the accompanying instruction transmitted from the central location. All the other "non-addressed" meters ignore the instruction. Appropriate instructions to any meter can illustratively include: send the current meter reading, repeat the previous transmission, set the current meter reading to zero, set the current meter reading to a specified number, toggle a computer controlled switch contained within the meter to selectively connect or dis-connect the load situated downstream of the meter from the power lines (e.g. in the event a user fails to pay for power or for selective load-shedding), and the like. Moreover, the central location can transmit a "block-addressed" message to a group of meters to effectuate a block- or systemwide operation involving all those meters, e.g. reset all the totalized values stored by these meters to zero or shut a portion of the power network down. In such case, the address would contain a suitable code to invoke all the meters in this group to respond to the instruction. In addition, each meter may similarly request information from the central location by transmitting an instruction, such as confirm the last instruction transmitted and/or confirm receipt of the most recently transmitted data. Hence, the signals that flow throughout the power network are shown as signals 6 which are comprised of messages having addresses, instructions and/or data which modulate the electrical power and are transmitted bi-directionally between any meter and the central location, and electrical power which acts as the carrier and is transmitted from any source, e.g. a sub-station, uni-directionally to any user. Clearly, if any user possessed the capability to generate electric power and apply it to the power network for sale to the utility, power would be transmitted bi-directionally between that user and the sub-station. A separate meter would measure the power generated by that user and, upon receipt of an appropriate instruction from the central location, would transmit data representing the amount of generated power to the central location. Well known inductive coupling is used to route transmitted messages around any power transformers and other distribution equipment, e.g. interrupters, (not shown) situated throughout the power network. Furthermore, well known repeaters (also not shown) are strategically positioned throughout the network to appropriately amplify any messages propagating down the network to a proper level, thereby compensating for any attenuation which the power network imparts to these messages.

In operation, the reading of a master meter (the "cumulative" value), such as from meter 7, situated on any distribution line, such as distribution line 5, should, in the absence of any power loss in the downstream distribution lines, e.g. lines 11a, 11b, 11c, . . . , 11n, always equal the sum of the individual totalized readings provided by all the measurement meters, such as meters 15a, 15b, 15c, . . . , 15n, situated downstream of that master meter. Any unusual discrepancy between the master meter reading and the summed value indicates loss of power, generally resulting from theft. To detect theft, equipment at the central location will query every meter and thereafter calculate the sum (the "aggregate" value) of the totalized readings of all the measurement meters connected to each distribution line and then check that sum against the master meter reading (cumulative value) for that line. Some discrepancy, usually very small, will always occur owing to the resistive loss in the lines running between the master and measurement meters; however, this resistive loss is readily determined and hence can be easily factored into the sum. To simplify the ensuing discussion, the resistive loss will be assumed to be zero. If no unexpected discrepancies occur in the readings for any distribution line, then the totalized reading provided by each individual measurement meter connected to that line can be used for billing purposes thereby dispensing with the need to send a meter reader to each of these measurement meters. Alternatively, if an unusual discrepancy occurs and it is determined that a user has by-passed a measurement meter and hence its reading is incorrect, the correct reading for that user can be easily obtained by subtracting the readings of all the other measurement meters from the reading of the master meter connected thereto. Hence, the difference between the correct and incorrect readings for any meter is generally the amount of power illegally taken from the network by a particular user. To quickly detect theft, all the meters are queried sufficiently often to enable the aggregate and cumulative values to be periodically updated, preferably at least once or twice a day. Furthermore, since each master meter preferably provides a cumulative value for a fairly small number of separate users, power theft can be quickly localized to only a small group of users all without the need of human intervention. By eliminating meter readers and dispensing with the need to send personnel to a meter site, except to perform repair work or to investigate suspected power theft occurring at that site, the inventive arrangement will likely yield substantial cost savings to a utility.

Figure 2:
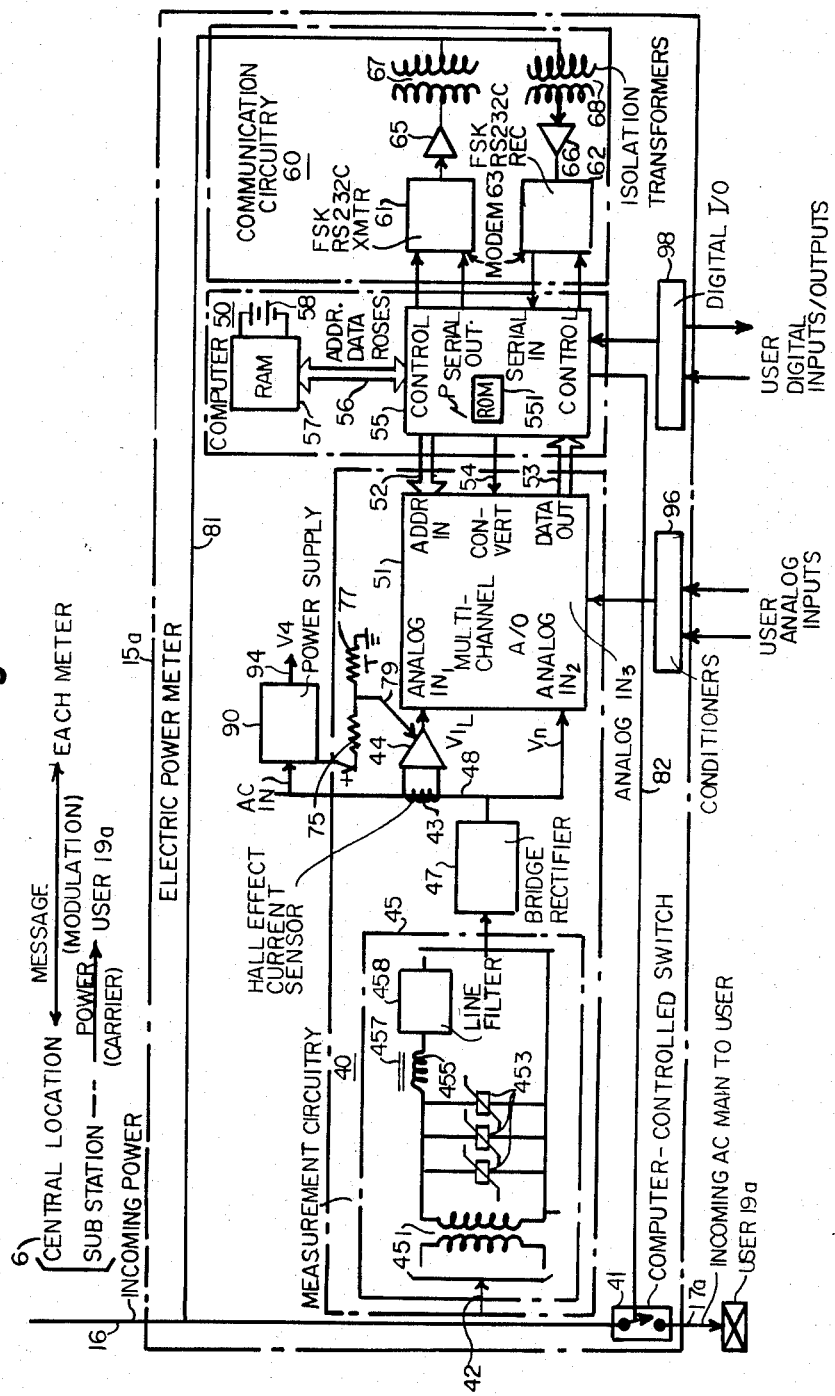
FIG. 2 is a block diagram of a remote reading electric power meter embodying the principles of the present invention for use in the metering system shown in FIG. 1.

A block diagram of a remote reading electric power meter, for use in the system shown in FIG. 1 and embodying the principles of the present invention, is depicted in FIG. 2. Inasmuch as this meter can serve either as a master or any measurement meter without any changes being made to its structure, this meter is illustratively shown and discussed as measurement meter 15a. As indicated in FIG. 2, electrical power is routed from line 11a, through meter 15a and from there downstream, via power line 17a, to user 19a.

Meter 15a is comprised of measurement circuitry 40, computer 50, communication circuitry 60 and power supply 90. Under control of computer 50, the measurement circuitry continuously measures values of the load voltage appearing at and the load current drawn by user 19a and supplies the computer with digital values proportional thereto. Computer 50, as instructed by its stored program, calculates the instantaneous power used by the load and totalizes the power useage over a pre-defined time interval, such as an hour, to produce a time-based totalized power consumption value, e.g. kilowatt hours consumed. A receiver contained within communication circuitry 60 continuously monitors line 11a to receive any messages transmitted from the central location by power line communication. All such received messages are applied to computer 50 which, in turn, determines if the address portion of each message matches the address for meter 15a which has been previously programmed into the computer. If these addresses match, then computer 50 responds to the accompanying instruction transmitted from the central location. In the event the instruction requests a meter reading from the meter 15a, then computer 50 accesses the totalized value from its memory and applies this value to the transmitter contained within communication circuitry 60 which, in turn, transmits this value along with appropriate communication protocols and accompanying identification information over the power line. Power supply 90, contains appropriate filtering and regulation circuitry and generates the appropriate DC voltages, which are applied to leads 94, to power all the circuitry contained within the meter.

Specifically, incoming AC power is routed in parallel both to user 19a, via computer controlled switch 41, and, via lead 42, to the input of measurement circuitry 40. As noted, measurement circuitry 40 generates digital values proportional to the instantaneous load current and voltage. To accomplish this, the load voltage is applied to the input of circuit 45. Within this circuit, transformer 451 isolates and steps the AC power voltage down to a much lower value, typically 12 volts AC. The output of the secondary of transformer 451 is applied to a filtering circuit comprised of voltage suppressing devices 453—typically appropriately rated well known metal oxide varistors having an extremely fast response time or other similar well known avalanche devices, and choke 457 and line filter 458. The line filter is of conventional design and the component values chosen for the suppressing devices, the choke and the line filter are all selected such that these components will effectively filter out spikes but not surges in the load voltage. Those spikes that are excessively high are clipped by voltage suppressing devices 453. Inasmuch as these voltage surges (voltage disturbances lasting longer than 500 micro-seconds) result from load changes which cause sharp short-term changes (usually increases) in power consumption, the power consumed during a surge should be measured. However, since voltage spikes (voltage disturbances lasting 500 microseconds or less) are generally externally induced, for example from lightning, and hence unrelated to any changes in the load itself, any changes in power consumption resulting from a spike should be ignored. If relevant the time constants for circuit 45 are selected properly, then this circuit will pass load voltage disturbances resulting from surges while effectively filtering any such disturbances resulting from spikes.

The output voltage produced by circuit 45 is full-wave rectified by bridge rectifier 47. The amplitude of the output voltage produced by the bridge-rectifier linearly varies in proportion to changes in the AC load voltage applied to user 19a, over power line 17a, and is hence denoted as $V_{VL}$. This output voltage is applied to one analog input of multi-channel (usually eight channel) analog-to-digital (A/D) converter 51 in order to produce an equivalent digital value. The bridge-rectified output voltage is also applied over lead 48 to the input of power supply 90. This supply contains conventional well known filtering and regulation circuitry which, as noted, generates all the necessary DC voltages required to power the entire meter circuitry.

The current flowing through the bridge rectifier linearly varies at a low level in proportion to variations in the load current provided over line 17a and drawn by user 19a. To measure the bridge rectifier output current, output lead 48 is routed through Hall effect current sensor 43. This sensor contains a Hall effect device. Such devices are well known and comprise a small slab of conductive material having a rectangular cross-section. Whenever a bias voltage is applied across two opposite surfaces of the slab, and a magnetic field is oriented such that its flux lines run through the slab in a direction perpendicular to the bias voltage and two other oppositely situated surfaces, then a low level (Hall effect) voltage appears across the remaining two oppositely situated surfaces which are both perpendicularly oriented to the applied magnetic field and to the bias voltage. The Hall effect voltage linearly varies in proportion to changes in the product of the field strength of the magnetic field and the bias voltage. Thus, if the bias voltage remains constant, then the Hall effect voltage varies linearly with changes in the magnetic field alone. The current flowing through lead 48 produces a magnetic field which is sensed by Hall effect device 43, which contains appropriate well known biasing circuitry (not shown). Hall effect current sensor 43, in turn, produces a Hall effect voltage that not only varies linearly with changes in the current appearing on lead 48 and but also varies linearly with changes in the load current appearing on line 17a. The Hall effect voltage produced by sensor 43 is appropriately amplified, temperature compensated and scaled by amplifier 44, the output of which is a voltage, denoted $V_{IL}$, which is, in turn, applied to the second analog input of A/D converter 51 in order to produce a digital value which linearly varies with the load current drawn by user 19a. Temperature compensation is preferably accomplished through use of a thermistor, e.g. thermistor 77, connected either in the biasing circuitry of amplifier 44 or, as shown, as part of a voltage divider (comprised of resistor 75 and thermistor 79) which produces a temperature dependent offset voltage that is applied, via lead 79, to amplifier 44 which, in turn, sums this voltage with the output of the Hall effect device. The thermistor has a temperature characteristic inverse to that of the Hall effect device.

The A/D converter, upon receipt of a convert command appearing over lead 54 and an appropriate address applied over bus 52 both generated by micro-processor 55 contained within computer 50, digitizes that one of its analog input signals selected by the address. The digital result is applied to bus 53 which, in turn, routes it to a parallel input of the micro-processor.

Computer 50 is comprised of micro-processor 55 and separate random access (RAM) memory 57 interconnected through bi-directional data and address buses 56. To simplify the figure, micro-processor 55 contains on-board read only (ROM) memory 551; however, depending upon the actual micro-processor chip used to implement micro-processor 55, ROM memory 551 may be external to rather than integral with the chip. Nonetheless, the operation of micro-processor 55 is governed by an appropriate program stored within the ROM memory. In particular, this program causes the A/D converter to periodically sample each of its analog inputs at a high rate, digitize the result and apply it to an input of the micro-processor. Thereafter, the micro-processor, under program control, processes the digitized load voltage and load current values, in a well known fashion, to produce a value equal to instantaneous power consumption and then totalizes the consumption values obtained thereby over a pre-defined interval to provide a measure of totalized consumption referenced to this interval, e.g. kilowatt-hours. In addition, this program contains well known digital filtering routines which are appropriately invoked to remove any residual spikes in the digitized values of the load current and load voltage. With the load voltage and current values, the micro-processor also periodically calculates the power factor value for the user and, upon request from the central location or upon a pre-defined change in this value, transmits the power factor value to the central location. By doing so, the utility obtains the capability to monitor the power factor associated with user 19a and select the appropriate electric rate in accordance therewith, both in real-time. In the past, utilities were generally unable to continually check the power factor associated with individual users. Hence, a utility would estimate the power factor based on information initially supplied by that user regarding the type of loads which it intended to connect to the power lines. Thereafter, users would, over the course of time, often change these loads and not notify the utility. This, in turn, caused the actual power factor to deviate from that estimated by the utility and often resulted in the user being unintentionally under- or over-charged for the power it consumes. By supplying real-time power factor information, the inventive meter allows the utility to continually select the proper rate for each of its users thereby eliminating these under- and overcharges. Moreover, by securing current accurate power factor information for each user, a utility can accurately determine the network wide power factor and can optimize the operation of its power generation equipment accordingly.

The micro-processor, under program control, also controls the operation of communication circuitry 60, as well as the communication itself occurring between meter 15a and the central location. In particular, the micro-processor periodically queries the communication circuit to determine whether it has received any incoming messages transmitted on the power line by the central location. As noted, each meter is programmed with a unique address which is either contained in the ROM or hardwired, through appropriate jumpers, to proper inputs to the micro-processor. If any such incoming message has been detected, then this message is read out by the communication circuit to the micro-processor, which, in turn, checks the address of the message against the unique meter address and, if the addresses match, as noted above, the micro-processor provides an appropriate response. If this response includes a transmission to the central location, then the micro-processor applies appropriate control signals and data to the communication circuit which, in response thereto, transmits a desired message to the central location. In addition, the micro-processor will, upon receipt of an appropriate instruction from the central location, apply an appropriate control signal, via lead 82, to the control input of computer controlled switch 41 to connect or dis-connect the load circuit situated downstream of meter 15a (in this case user 19a) from distribution line 11a. Such a dis-connection can typically occur either in response to non-payment or for selective load shedding. Within computer 50, RAM memory 57 stores data generated by the stored program. Inasmuch as this data includes the totalized consumption value, battery 58 provides a stand-by source of power to the memory in order to preserve this data in the event of a temporary power outage on line 11a.

Communication circuitry 60 includes modem 63, comprised of separate transmitter and receiver 61 and 62, respectively, buffers 65 and 66, and isolation transformers 67 and 68. The transmitter and receiver are each preferably a standard single chip circuit (such as the XR-2206 send and the XR-2211 receive chips manufactured by the Exar Corporation) which send and receive serial ASCII frequency shift keyed (FSK) encoded information based on the RS-232C protocol. Buffer 65 amplifies the output of FSK transmitter 61 to a sufficient level and then applies the buffered output to one side of isolation transformer 67 which, in turn, couples the transmitted message onto the power line, via lead 81, thereby appropriately modulating the power signal with an outgoing serial message. Lead 81 also carries incoming messages transmitted by the central location. Incoming messages appearing on lead 81 are first routed through isolation transformer 68 and then amplified to an appropriate level by buffer 66. From there, these incoming messages are applied to an input of FSK receiver 62 which demodulates all these messages from the power signal carrier and applies the resulting serial signal to the micro-processor.

Clearly, each meter can transmit information other than just the accumulated power consumption and the power factor values to a central location. Such additional information can easily include water and gas meter readings, intrusion and/or fire alarm status information, as well as status information of any other equipment located at the user's site. To accomplish this, appropriate externally supplied signals representing any additional item of information can be readily applied by a user in analog form to an appropriate input of the A/D converter, via well known analog signal conditioners 96, or in digital form, through the digital inputs of digital input/output circuit 98 (typically a well known register or the like), to appropriate input(s) to the micro-processor. The program stored in the ROM memory would be appropriately changed such that the micro-processor would sense the information present at these inputs and, upon receipt of an appropriate instruction, transmit this information, in serial FSK form, to the central location. Furthermore, a display could be attached to the micro-processor to provide a local indication of accumulated power consumption and/or other data, such as load voltage, load current power factor and/or even diagnostic information. In addition, the micro-processor could be used to control various devices (furnaces, motors, etc.) situated at the user site and external to the meter. In particular, the micro-processor would, in this instance, be appropriately programmed to respond to various instructions transmitted from the central location to selectively control each of these devices through the digital outputs of digital input/output circuit 98. In addition, the micro-processor could contain or be connected to a real-time clock. This would allow the micro-processor to provide time-of-day metering and/or to selectively control external devices not only in response to specific instructions transmitted from the central location but also in response to the current time of day. In lieu of a real-time clock, the microprocessor could alternativley count down a reference frequency (e.g. the micro-processor clock signal or the power line frequency) and, through well-known timing loops implemented in software, fabricate one or more relative time offsets for use in generating separate time-based totalized consumption values for time-of-day metering. Furthermore, since all the meters possess bi-directional communication circuitry, any one meter can be programmed to communicate with any other meter, e.g. to pass data therebetween or invoke diagnostics, should the need arise. For example, each master meter situated on any distribution line can be programmed such that its processor will in effect query all the measurement meters, which measure power drawn from that line, and then obtain and store, in its RAM memory, all the totalized values therefrom. Thereafter, the central location can query all the master meters to obtain each master meter reading ("cumulative" value) as well as all the associated totalized values previously stored in each master meter. In addition, any master meter, through its computer, can also sum all the totalized values it obtains from is downstream measurement meters and check that sum against its own reading (the cumulative value) to determine any theft of power occurring on its distribution line. This meter-to-meter communication and this localized processing performed by each master meter, in turn, eliminate the need for the central location to separately query each measurement meter, thereby advantageously saving processing time at the central location.

Although a preferred embodiment has been shown and described above, this merely illustrates the teachings of the present invention. Clearly, many other embodiments can be constructed based upon these teachings without departing from the spirit and scope of the invention.

I claim:

1. A system for measuring electrical power flowing through a power network to various loads and for detecting loss of power therefrom, the network having at least one power distribution line for feeding electrical power to a plurality of said loads through corresponding power lines, wherein each of said power lines is connected at one end thereof to an associated one of said loads and at the other end thereof to said distribution line, said system comprising:

a measurement meter situated on each of said power lines upstream of an associated load, wherein said measurement meter further includes means for measuring the instantaneous amount of electrical power consumed by the associated load, means for totalizing the instantaneous amount over a predefined period of time in order to generate a totalized value indicative of the amount of power consumed by the associated load throughout the predefined time period, and means for transmitting said totalized value over said network upon receipt of an appropriate instruction, a master meter situated on said distribution line, wherein said master meter further includes means for measuring the total amount of instantaneous electrical power flowing therethrough to all of the associated loads, means for providing a cumulative value indicative of the total amount of power consumed by all of said associated loads throughout said predefined time period, and means for transmitting said cumulative value over said network upon receipt of an appropriate instruction, and first processing means situated on said network for transmitting at least one of said instructions over said network to said measurement meter and for receiving the totalized value from each of said measurement meters, and second processing means situated on said network for transmitting other ones of said instructions and for receiving the cumulative value from said master meter, wherein either said first or second processing means further includes means for summing all the totalized values to form an aggregate value, and means for comparing the aggregate value against the cumulative value to determine any unusual discrepancies therebetween indicative of said loss.

2. The system of claim 1 wherein the master meter is further comprised of said first processing means and said second processing means is situated at a central location remote from said master meter.

3. The system of claim 1 wherein the central location is further comprised of said first and second processing means.

4. The system of claims 2 or 3 wherein each transmission over said network to each of said meters is comprised of at least an address portion and an accompanying instruction portion.

5. The system of claim 4 wherein each of said meters further comprises means for programming a pre-defined address into that meter, means for ascertaining the address portion of each received transmission, and means for inhibiting the meter from executing the accompanying instruction in the event the address portion of any such transmission does not match the programmed address.

6. The system of claim 5 wherein the first processing means further comprises means for repetitively updating the aggregate value by periodically querying each of the measurement meters to obtain the totalized value provided therefrom, means for calculating the sum of all the totalized values, and means for updating the aggregate value as being equal to the sum.

7. The system of claim 6 wherein each of said meters further comprises means for determining power factor of the associated load, and means for transmitting the value of the power factor over said power network in response to an appropriate instruction transmitted over the network or to a pre-defined change in the power factor value.

8. The system of claim 6 further comprising means for compensating either the aggregate value or the cumulative value for the amount of any pre-determined electrical loss occurring in the power lines situated between the master meter and all the measurement meters.

9. The system of claim 5 wherein each of said meters further comprises:

means, responsive to the voltage appearing on said power line and feeding a load situated downstream of said meter, for providing a filtered signal that is proportional to said line voltage and contains substantially all voltage perturbations resulting from load induced consumption surges but is substantially free of any such perturbations resulting from spikes occurring in said line voltage, circuit means, responsive to said filtered signal, for generating first and second signals proportional to the values of instantaneous load voltage and load current, respectively, communication means connected to said power line for establishing bi-directional communication, over said power line, between the meter and a location remote from the meter, and third processing means, connected to said circuit means and to said communication means and responsive to said first and second signals, for calculating the value of instantaneous power consumed by the load and for totalizing the instantaneous power value over the pre-defined period of time to produce the totalized value, and wherein said third processing means, in response to an appropriate instruction appearing on said power line and received by said communication means, applies said totalized value to said communication means for transmission over said power line to said location.

10. The meter in claim 9 wherein said circuit means further comprises a Hall effect device, responsive to said filtered signal, for generating said second signal based upon perturbations occurring in current flow of said filtered signal.

11. The meter in claim 9 further comprised of a computer-controlled switch for selectively connecting or dis-connecting the load from the power line in response to a suitable instruction transmitted over said network.

12. The meter in claim 11 further comprising means, responsive to at least one externally supplied input signal, for monitoring the status of said input signal, and means for providing at least one output signal which changes in a predefined fashion in response to any changes in the status of the input signal.

13. The meter in claim 12 wherein the meter further comprises means for communicating the status of the input signal to the location in response to an appropriate instruction transmitted over the network or to a pre-defined change in the status.

14. The system in claim 13 wherein the communication occurring over the network between any meter and the location remote therefrom is in the form of frequency shift keyed encoded signals.

15. A power meter, for connection to a power line upstream of a load connected to the line, for measuring the amount of electrical power consumed by the load and for transmitting, over the power line, information indicative of the amount of totalized power consumed by the load throughout a defined period of time to a location remote therefrom, said meter comprising:

means, for quantifying power consumed employing the use of a Hall effect sensor wherein the circuit means include means for temperature compensating in inverse proportion to any temperature characteristic of the Hall effect device and or further means, responsive to the voltage appearing on said power line and feeding said load, for providing a filtered signal that is proportional to said line voltage and contains substantially all voltage perturbations resulting from load induced consumption surges but is substantially free of any such perturbations resulting from spikes occuring in said line voltage, circuit means, responsive to said filtered signal, for generating first and second signals proportional to the values of load voltage and load current respectively, communication means connected to said power line for establishing bi-directional communication over said power line, between the meter and the location, and processing means, connected to said circuit means and said communication means and responsive to said first and second signals, for calculating a value of instantaneous power consumed by the load and for totalizing the instantaneous power value over a defined period of time to produce a totalized value, and wherein said processing means in response to an appropriate instruction appearing on said power line and received by said communication means, applies said totalized value to said communication means for transmission over said power line to said location.

16. The meter of claim 15 further comprising means for transmitting messages over said power line wherein each of said messages comprises an address portion and an accompanying instruction portion.

17. The meter of claim 16 wherein said meter further comprises means for programming a pre-defined address into that meter, means for ascertaining the address portion of each transmission, and means for inhibiting the meter from executing the accompanying instruction in the event the address portion of any such transmission does not match the programmed address.

18. The meter in claim 17 wherein said circuit means further comprises: means for rectifying the filtered signal to produce the first signal, and a Hall effect device, responsive to current flow in said first signal, for generating said second signal based upon perturbations in the current flow.

19. The meter of claim 18 wherein the temperature compensating means is comprised of a thermistor having a temperature characteristic substantially inversely proportional to the temperature characteristic of the Hall effect device.

20. The meter of claim 17 wherein said meter further comprises means for determining power factor of the associated load, and means for transmitting the value of the power factor to the location in response to an appropriate instruction transmitted over the power network or to a pre-defined change in the power factor value.

21. The meter in claim 17 further comprised of a computer-controlled switch for selectively connecting or disconnecting the load from the power line in response to a suitable instruction transmitted from said location.

22. The meter in claim 17 further comprising means, responsive to at least one externally supplied input signal, for monitoring the status of said input signal, and means for providing at least one output signal which changes in a pre-defined fashion in response to any changes in the status of the input signal.

23. The meter in claim 22 wherein the meter further comprises means for communicating the status of the externally supplied input signal to the location in response to an appropriate instruction transmitted over the network or to a pre-defined change in the status of the input signal.

* * * * *